(12) United States Patent
Peng et al.

(10) Patent No.: US 10,747,349 B2
(45) Date of Patent: Aug. 18, 2020

(54) DISPLAY SUBSTRATE, DISPLAY PANEL, DISPLAY APPARATUS AND METHOD FOR DRIVING THE SAME

(71) Applicants: BOE TECHNOLOGY GROUP CO., LTD., Beijing (CN); BEIJING BOE OPTOELECTONICS TECHNOLOGY CO., LTD., Beijing (CN)

(72) Inventors: Yong Peng, Beijing (CN); Yangheng Li, Beijing (CN); Hanqing Liu, Beijing (CN); Weixiong Chen, Beijing (CN); Le Zhang, Beijing (CN); Gang Yu, Beijing (CN); Ling Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 30 days.

(21) Appl. No.: 16/210,912

(22) Filed: Dec. 5, 2018

(65) Prior Publication Data
US 2019/0346953 A1 Nov. 14, 2019

(30) Foreign Application Priority Data
May 8, 2018 (CN) .......................... 2018 1 0430314

(51) Int. Cl.
*G06F 3/044* (2006.01)
*G06F 3/041* (2006.01)
(Continued)

(52) U.S. Cl.
CPC ............ *G06F 3/0412* (2013.01); *G06F 3/044* (2013.01); *G06F 3/047* (2013.01); *G09G 3/20* (2013.01);
(Continued)

(58) Field of Classification Search
CPC ........ G06F 3/0412; G06F 3/047; G06F 3/044; G09G 3/20; G09G 2300/0408; G09G 2300/0426; H01L 27/124
See application file for complete search history.

(56) References Cited

U.S. PATENT DOCUMENTS

2010/0060602 A1* 3/2010 Agari ...................... G06F 3/044
345/173
2010/0253647 A1* 10/2010 Agari .................... G06F 3/0416
345/174
(Continued)

*Primary Examiner* — Carolyn R Edwards
(74) *Attorney, Agent, or Firm* — Kinney & Lange, P.A.

(57) ABSTRACT

Embodiments of the present disclosure disclose a display substrate, a display panel, a display apparatus, and a method for driving a display apparatus. The display substrate includes: a plurality of first wiring groups each comprising a plurality of first wirings extending in a first direction; a plurality of second wiring groups each comprising a plurality of second wirings and at least one transmission signal line extending in a second direction crossing the first direction; a plurality of first switching circuits each connecting a plurality of first wirings in a corresponding one of the first wiring groups to a control signal line; and a plurality of second switching circuits each connecting a plurality of second wirings in a corresponding one of the second wiring groups to the control signal line.

11 Claims, 8 Drawing Sheets

(51) Int. Cl.
  *G06F 3/047*    (2006.01)
  *G09G 3/20*     (2006.01)
  *H01L 27/12*    (2006.01)
(52) U.S. Cl.
  CPC ... *H01L 27/124* (2013.01); *G09G 2300/0408* (2013.01); *G09G 2300/0426* (2013.01)

(56) References Cited

U.S. PATENT DOCUMENTS

| | | | |
|---|---|---|---|
| 2012/0154326 A1* | 6/2012 | Liu | G06F 3/0412 345/174 |
| 2012/0218199 A1* | 8/2012 | Kim | G06F 3/0412 345/173 |
| 2012/0229420 A1* | 9/2012 | Liu | G06F 3/046 345/174 |
| 2013/0093721 A1* | 4/2013 | Nakamura | G06F 3/044 345/174 |
| 2014/0160061 A1* | 6/2014 | Kim | G06F 3/044 345/174 |
| 2015/0277657 A1* | 10/2015 | Azumi | G06F 3/044 345/174 |
| 2016/0011687 A1* | 1/2016 | Ding | G06F 3/0412 345/174 |
| 2016/0041666 A1* | 2/2016 | Lee | G06F 3/044 345/174 |
| 2016/0188040 A1* | 6/2016 | Shin | G06F 3/044 345/174 |
| 2017/0010712 A1* | 1/2017 | Yoshizumi | H01L 27/3276 |
| 2017/0160845 A1* | 6/2017 | Lee | G06F 3/0412 |
| 2017/0192573 A1* | 7/2017 | Kim | G06F 3/0416 |
| 2018/0335878 A1* | 11/2018 | Chen | G06F 3/0416 |

\* cited by examiner

DISPLAY SUBSTRATE, DISPLAY PANEL, DISPLAY APPARATUS AND METHOD FOR DRIVING THE SAME

CROSS-REFERENCE TO RELATED APPLICATION(S)

This application claims priority to the Chinese Patent Application No. CN201810430314.3, filed on May 8, 2018, entitled "DISPLAY SUBSTRATE, DISPLAY PANEL, DISPLAY APPARATUS AND METHOD FOR DRIVING THE SAME", which is incorporated herein by reference in its entirety.

TECHNICAL FIELD

Embodiments of the present disclosure relate to the field of display, and more particularly, to a display substrate, a display panel, a display apparatus, and a method for driving a display apparatus.

BACKGROUND

Touch display apparatuses are becoming more and more widely used. In a display panel of a touch display apparatus, transparent electrodes are multiplexed. In a display phase, the transparent electrodes are used as common electrodes. In a touch phase, the transparent electrodes are used as touch electrodes. Here, the transparent electrodes are divided into a plurality of touch blocks which are independent of each other based on a touch resolution, to collect touch signals at various positions respectively.

However, for a conventional touch display apparatus, there is an urgent problem to be solved that a display picture of the touch display apparatus is uneven.

SUMMARY

At least one embodiment of the present disclosure provides a display substrate, a display panel, a display apparatus, and a method for driving a display apparatus.

According to an aspect of the embodiments of the present disclosure, there is proposed a display substrate, comprising:

a plurality of first wiring groups each comprising a plurality of first wirings extending in a first direction;

a plurality of second wiring groups each comprising a plurality of second wirings and at least one transmission signal line extending in a second direction crossing the first direction;

a plurality of first switching circuits each connecting a plurality of first wirings in a corresponding one of the first wiring groups to a control signal line; and a plurality of second switching circuits each connecting a plurality of second wirings in a corresponding one of the second wiring groups to the control signal line.

In an example, for each of the first wiring groups, at least one first wiring in a first wiring group is electrically connected to a transmission signal line in a corresponding one of the plurality of second wiring groups via at least one first via.

In an example, each of the plurality of first switching circuits comprises at least one Thin Film Transistor (TFT), each TFT having a control electrode connected to the control signal line, and a first electrode and a second electrode connected to two adjacent first wirings in a corresponding one of the plurality of first wiring groups respectively; and each of the plurality of second switching circuits comprises at least one TFT, each TFT having a control electrode connected to the control signal line, and a first electrode and a second electrode connected to two adjacent second wirings in a corresponding one of the plurality of second wiring groups respectively.

In an example, the display substrate further comprises: a gate layer and a source/drain layer, wherein the plurality of first wirings are located in the gate layer, and the plurality of second wirings and the at least one transmission signal line are located in the source/drain layer.

In an example, the display substrate further comprises: a gate layer, a source/drain layer, and a touch layer, wherein the plurality of first wirings are located in the gate layer, and the plurality of second wirings and the at least one transmission signal line are located in the touch layer.

In an example, the plurality of second wirings comprise wirings for touch sensing.

In an example, the display substrate according to the embodiments of the present disclosure further comprises: a single common electrode.

In an example, the common electrode is electrically connected to the second wiring groups via at least one second via.

According to another aspect of the embodiments of the present disclosure, there is proposed a display panel, comprising the display substrate according to the embodiments of the present disclosure.

According to yet another aspect of the embodiments of the present disclosure, there is proposed a display apparatus, comprising the display panel according to the embodiments of the present disclosure and a driver Integrated Circuit (IC).

In an example, the driver IC is connected to the second wiring groups and is connected to the first wiring groups via the at least one transmission signal line.

In an example, the driver IC is connected to the common electrode via the second wiring groups.

According to a further aspect of the embodiments of the present disclosure, there is proposed a method for driving the display apparatus according to the embodiments of the present disclosure, the method comprising:

switching off, during a display period of one image frame, the first switching circuits and the second switching circuits under control of a control signal on the control signal line; and switching on, during a touch period of the one image frame, the first switching circuits and the second switching circuits, under control of the control signal.

In an example, in the touch period, the driver IC is configured to apply a touch scanning signal to the first wiring groups, and detect whether self-capacitance of the first wirings and the second wirings change.

BRIEF DESCRIPTION OF THE DRAWINGS

In order to more clearly illustrate the technical solutions according to the embodiments of the present disclosure, the accompanying drawings used in the description of the embodiments will be briefly described below. The accompanying drawings in the following description are merely some embodiments of the present disclosure, and those of ordinary skill in the art can obtain other accompanying drawings according to these accompanying drawings without any creative work. In the accompanying drawings.

DETAILED DESCRIPTION

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be noted that throughout the accompanying drawings, the same elements are represented by the same or similar reference signs. In the following description, some specific embodiments are for illustrative purposes only and are not to be construed as limiting the present disclosure, but merely examples of the embodiments of the present disclosure.

The conventional structure or construction will be omitted when it may cause confusion with the understanding of the present disclosure. It should be noted that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Transistors used in the embodiments of the present disclosure may be thin film transistors or field effect transistors or other devices having the same characteristics. For instance, the thin film transistors used in the embodiments of the present disclosure may be oxide semiconductor transistors. Since a source and a drain of a thin film transistor used here are symmetrical, the source and the drain thereof may be interchanged. In the embodiments of the present disclosure, the gate is referred to as a control electrode, one of the source and the drain is referred to as a first electrode, and the other of the source and the drain is referred to as a second electrode, depending on functions thereof. In the following examples, an N-type thin film transistor is taken as an example for description. It may be understood by those skilled in the art that the embodiments of the present disclosure are obviously applicable to a case of P-type thin film transistors.

Figure 1A:
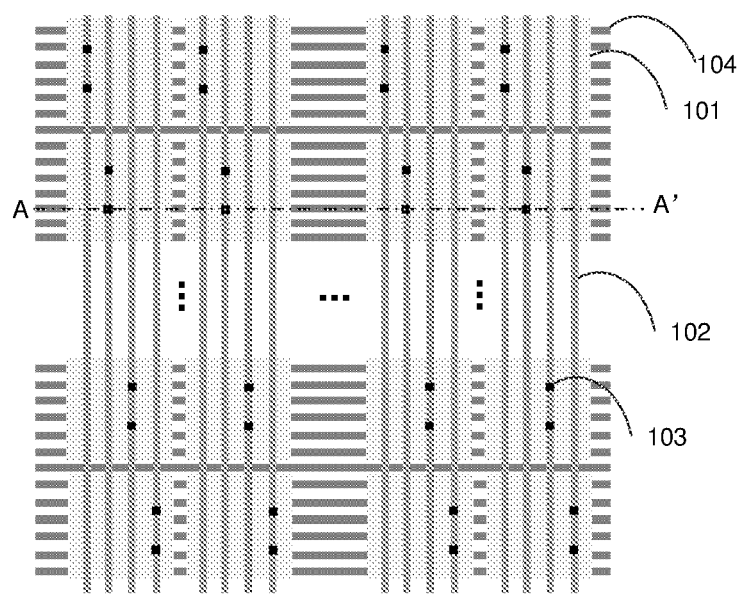
FIG. 1A illustrates a schematic view of a display substrate.
Figure 1B:
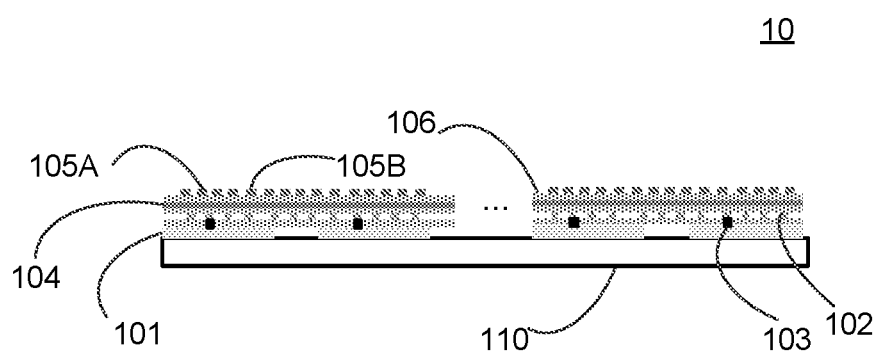
FIG. 1B illustrates a schematic cross-sectional view of the display substrate taken along line A-A' in FIG. 1A.

FIG. 1A illustrates a schematic view of a display substrate, and FIG. 1B illustrates a schematic cross-sectional view taken along line A-A' in FIG. 1A. As shown in FIGS. 1A and 1B, the display substrate 10 may comprise a base 110. A common electrode 101 is divided into a plurality of common electrode blocks which are independent of each other based on a touch resolution. In an example of FIG. 1A, the common electrode is divided into an array of common electrode blocks in I rows and J columns, wherein I and J are integers greater than one. Each of the common electrode blocks is connected to a corresponding touch signal line 102 via a via 103 and is connected to a touch IC via the touch signal line 102. During a display period of one image frame, a common voltage Vcom is applied to each of the common electrode blocks via a corresponding touch signal line 102 for image display. During a touch period of one image frame, a touch scanning signal is applied by the touch IC to each of the common electrode blocks via a corresponding touch signal line 102, it is detected whether self-capacitance between the common electrode block and a finger changes, and the change is fed back to the touch IC. If the change which occurs is beyond a certain threshold, the touch IC determines that a touch occurs at a position where the common electrode block is located.

As shown in FIG. 1B, the display substrate 10 further comprises gate lines 104 located in a different layer from that of touch signal lines 102 and a source/drain electrode layer 105 located in a different layer from that of the touch signal lines 102 and the gate lines 104, wherein the layers are insulated from each other by respective insulating layers 106. The source/drain electrode layer 105 may comprise source driving signal lines 105A and source/drain metal wirings 105B.

It may be understood by those skilled in the art that the display substrate 10 of FIGS. 1A and 1B may further comprise pixel circuits, an array of thin film transistors, various power supply lines, etc. For the sake of brevity, the above elements are not shown in FIGS. 1A and 1B and will not be described in detail in the embodiments of the present disclosure. Further, it may be understood by those skilled in the art that only one example of a stacked relationship among various layers and wirings is shown in FIGS. 1A and 1B, the common electrode 101, the touch signal lines 102, the gate lines 104, and the source/drain electrode layer 105 on the base 110 are not necessarily in the stacked relationship shown in FIG. 1B, and may be in another stacked relationship as long as they are located in different layers.

It should be illustrated that in the exemplary display substrate shown in FIGS. 1A and 1B, the common voltage Vcom is applied to various common electrode blocks respectively via the plurality of touch signal lines 102 which are independent of each other, which makes it difficult to achieve a completely consistent common voltage Vcom among the common electrode blocks, which easily causes unevenness of a display picture.

Figure 2A:
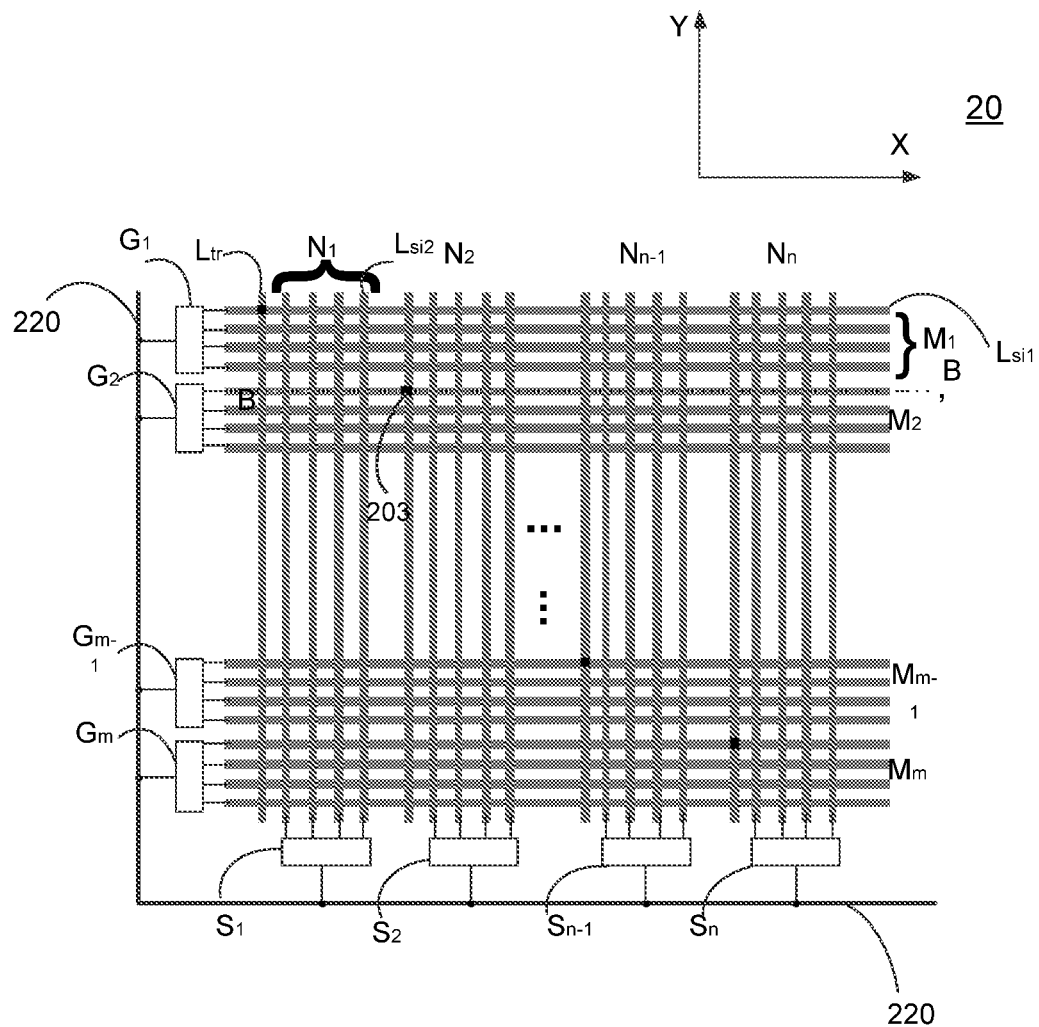
FIG. 2A illustrates a schematic view of a display substrate according to an exemplary embodiment of the present disclosure.
Figure 2B:
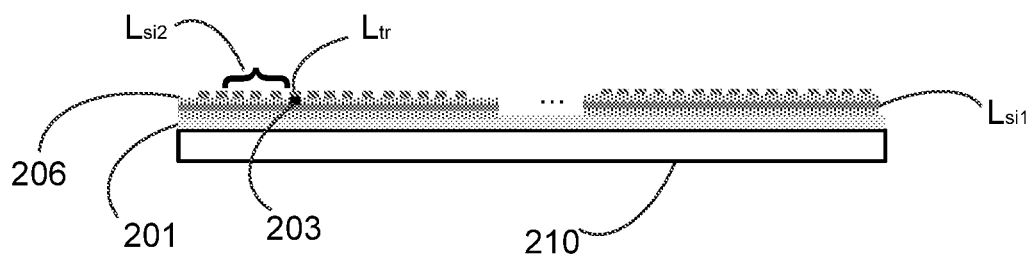
FIG. 2B illustrates a partial schematic cross-sectional view of the display substrate taken along line B-B' in FIG. 2A.

FIG. 2A illustrates a schematic view of a display substrate according to an exemplary embodiment of the present disclosure, and FIG. 2B illustrates a partial schematic cross-sectional view of the display substrate taken along line B-B' in FIG. 2A. A display substrate 20 according to an embodiment of the present disclosure will be described subsequently with reference to FIGS. 2A and 2B.

As shown in FIGS. 2A and 2B, the display substrate 20 according to the embodiment of the present disclosure may comprise a plurality of first wiring groups $M_1$-$M_m$, wherein m is an integer greater than one. The first wiring groups $M_1$-$M_m$ each comprise a plurality of first wirings Lsi1 extending in a first direction X. In an example of FIG. 2A, it is illustrated that each of the first wiring groups comprises four first wirings. It may be understood by those skilled in the art that the embodiments of the present disclosure are not limited thereto, and each of the first wiring groups according to the embodiment of the present disclosure may of course comprise other numbers of first wirings Lsi1.

The display substrate 20 according to the embodiment of the present disclosure may further comprise a plurality of second wiring groups $N_1$-$N_n$, wherein n is an integer greater than one. The second wiring groups $N_1$-$N_n$ each comprise a plurality of second wirings Lsi2 and at least one transmission signal line Ltr extending in a second direction Y crossing the first direction X. In some embodiments, the second direction Y is substantially perpendicular to the first direction X. However, the present disclosure is not limited thereto. In the example of FIG. 2A, it is illustrated that each of the second wiring groups comprises four second wirings Lsi2 and one transmission signal line Ltr. It may be understood by those skilled in the art that the embodiments of the present disclosure are not limited thereto, and each of the second wiring groups according to the embodiment of the present disclosure may have other numbers of second wirings Lsi2 and more transmission signal lines Ltr.

The display substrate 20 according to the embodiment of the present disclosure may further comprise a plurality of first switching circuits $G_1$-$G_m$. The plurality of first switching circuits $G_1$-$G_m$ each are configured to selectively electrically connect a plurality of first wirings in each of the first wiring groups under control of a signal from a control signal line 220. The display substrate 20 according to the embodiment of the present disclosure may further comprise a plurality of second switching circuits $S_1$-$S_n$. The plurality of second switching circuits $S_1$-$S_n$ each are configured to selectively electrically connect a plurality of second wirings in each of the second wiring groups under control of the signal from the control signal line 220.

According to an embodiment of the present disclosure, for each of the first wiring groups, at least one first wiring in the first wiring group is electrically connected to a transmission signal line in a corresponding one of the plurality of second wiring groups via at least one first via. For example, in the example of FIG. 2A, for a first wiring group $M_1$, at least one first wiring in the first wiring group $M_1$ is electrically connected to a transmission signal line Ltr in a second wiring group $N_1$ via at least one first via (for example, a dark point where the first wiring group $M_1$ intersects the second wiring group $N_1$ in FIG. 2A). As another example, for a first wiring group $M_2$, at least one first wiring in the first wiring group $M_2$ is electrically connected to a transmission signal line Ltr in a second wiring group $N_2$ via at least one first via 203 (for example, a dark point where the first wiring group $M_2$ intersects the second wiring group $N_2$ in FIG. 2A). Similarly, for a first wiring group $M_{m-1}$, at least one first wiring in the first wiring group $M_{m-1}$ is electrically connected to a transmission signal line Ltr in a second wiring group $N_{n-1}$ via at least one first via (for example, a dark point where the first wiring group $M_{m-1}$ intersects the second wiring group $N_{n-1}$ in FIG. 2A). For a first wiring group $M_m$, at least one first wiring in the first wiring group $M_m$ is electrically connected to a transmission signal line Ltr in a second wiring group $N_n$ via at least one first via (for example, a dark point where the first wiring group $M_m$ intersects the second wiring group $N_n$ in FIG. 2A).

For the sake of brevity, it is merely illustrated in the example of FIG. 2A that for one first wiring group, one first wiring in the first wiring group is electrically connected to a transmission signal line via one first via (for example, the first via 203). However, it may be understood by those skilled in the art that the embodiments of the present disclosure are not limited thereto. According to an embodiment of the present disclosure, for one first wiring group, a plurality of first wirings in the first wiring group may be electrically connected to a transmission signal line via a plurality of first vias. Thereby, it may not only avoid a problem that when only one via is to be formed, there is no electrical connection between the first wirings and the transmission signal line due to failure in punching of the via during a manufacturing process, but also may reduce resistance on the transmission signal line.

Further, although it seems to be the case where m is equal to n in FIG. 2A, the present disclosure is not limited thereto. In fact, when m is not equal to n, there may be a case where a plurality of first wiring groups are connected to a transmission signal line in the same second wiring group via first vias, or there may be a case where corresponding transmission signal lines of a plurality of second wiring groups are electrically connected to the same first wiring group via first vias, or there may be a case where a corresponding transmission signal line(s) of one or more second wiring groups is(are) not connected to any of the first wiring groups. Further, even if m is equal to n, there may be one or more of these cases.

FIG. 2B illustrates a partial schematic cross-sectional view of the display substrate 20 taken along line B-B' in FIG. 2A. It should be illustrated that, for the sake of brevity, the switching circuits in FIG. 2A are not shown in the cross-sectional view in FIG. 2B. It may be understood by those skilled in the art that the display substrate 20 shown in FIGS. 2A and 2B may further comprise pixel circuits, an array of thin film transistors, various power supply lines, etc. For the sake of brevity, the above elements are not shown in FIGS. 2A and 2B and will not be described in detail in the embodiments of the present disclosure.

As shown in FIG. 2B, the display substrate 20 may comprise a base 210. The display substrate 20 may further comprise a common electrode 201, the first wiring groups $M_1$-$M_m$, and the second wiring groups $N_1$-$N_n$ on the base 210. Each of the first wiring groups may comprise a plurality of first wirings Lsi1, and each of the second wiring groups may comprise a plurality of second wirings Lsi2 and at least one transmission signal line Ltr.

Further, it may be understood by those skilled in the art that only one example of a stacked relationship among various layers and wirings is shown in FIGS. 2A and 2B, the base 210, the common electrode 201, the first wiring groups and the second wiring groups are not necessarily in the stacked relationship shown in FIG. 2B, and may be in another stacked relationship, as long as they are located in different layers.

Compared with the display substrate 10 of FIGS. 1A and 1B, as shown in FIG. 2B, it is not necessary to divide the common electrode into common electrode blocks in the display substrate 20 according to the embodiment of the present disclosure, and thereby a common voltage Vcom may be uniformly applied to the entire common electrode. In this way, a uniform common voltage may be realized in the entire display area during a display period, thereby avoiding a case where the display picture is uneven.

According to an embodiment of the present disclosure, the first wirings Lsi1 may be wirings located in a gate layer, for example, gate driving signal lines. The second wirings Lsi2 and the transmission signal line Ltr may wirings located in a touch layer. For example, the second wirings Lsi2 and the transmission signal line Ltr may be wirings for touch sensing, which are located in a different layer from the gate layer and a source/drain layer. The wirings for touch sensing are also referred to as "Layer 3 wirings" for transmitting a common voltage signal Vcom during a display period of the display substrate and transmitting a touch signal Tx during a touch period of the display substrate.

According to another embodiment of the present disclosure, the first wirings Lsi1 may be wirings located in the gate layer, for example, the gate driving signal lines. The second wirings Lsi2 and the transmission signal line Ltr may be wirings located in the source/drain layer. For example, the second wirings Lsi2 may comprise source driving signal lines and metal wiring(s) for touch sensing in the source/drain layer. The transmission signal line Ltr may be a metal wiring in the source/drain layer for transmitting the common voltage signal Vcom in the display period of the display substrate and transmitting the touch signal Tx in the touch period of the display substrate. In this embodiment, the display substrate 20 comprises only two wiring layers, for example, a wiring layer for the first wiring groups and a wiring layer for the second wiring groups etc. Compared with the display substrate 10 of FIGS. 1A and 1B which comprises at least three wiring layers, the wiring layers are reduced by one in the display substrate 20 according to the embodiment of the present disclosure, so that the display substrate may have a reduced thickness.

The display substrate according to the embodiment of the present disclosure may be a liquid crystal display substrate or an organic light emitting diode display substrate, which is not limited in the embodiment of the present disclosure.

Figure 3:
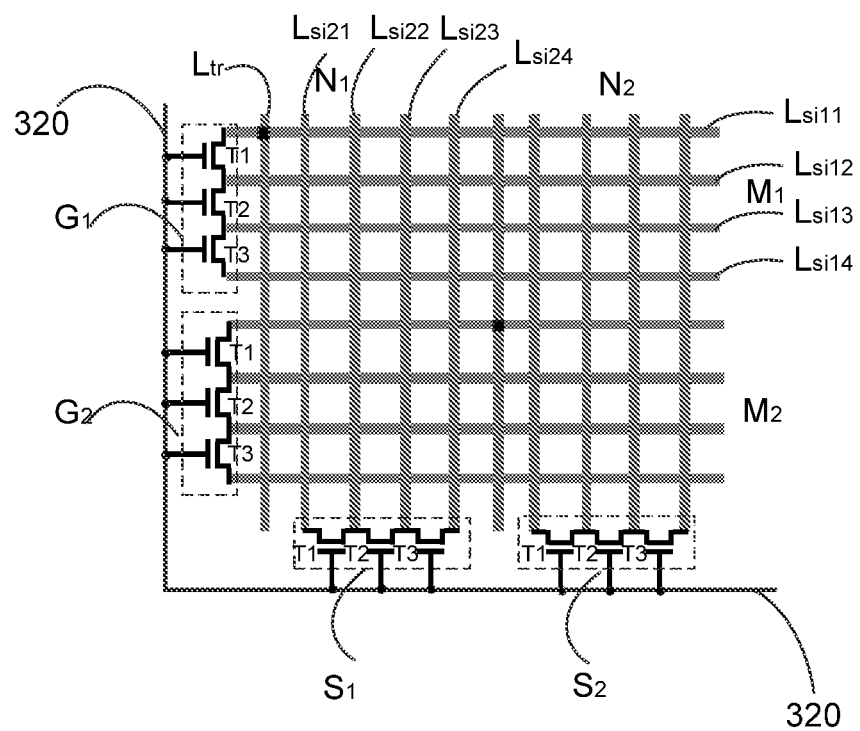
FIG. 3 illustrates a schematic view of a display substrate according to another embodiment of the present disclosure.

FIG. 3 illustrates a schematic view of a display substrate according to another embodiment of the present disclosure. As shown in FIG. 3, a first switching circuit G1 in the display substrate 30 according to the embodiment of the present disclosure comprises at least one Thin Film Transistor (TFT), each having a control electrode connected to a control signal line 320, and a first electrode and a second electrode connected to two adjacent ones of first wirings in a first wiring group $M_1$ respectively. In an example of FIG. 3, the first wiring group $M_1$ may comprise four first signal lines Lsi11, Lsi12, Lsi13, and Lsi14, and the first switching circuit G1 may comprise three thin film transistors T1, T2, and T3. The transistor T1, the transistor T2, and the transistor T3 each have a control electrode connected to the control signal line 320. The transistor T1 has a first electrode connected to the first signal line Lsi11, and a second electrode connected to the first wiring Lsi12 in $M_1$ which is adjacent to the first wiring Lsi11. The transistor T2 has a first electrode connected to the first wiring Lsi12, and a second electrode connected to the first wiring Lsi13 in $M_1$ which is adjacent to the first wiring Lsi12. The transistor T3 has a first electrode connected to the first wiring Lsi13, and a second electrode connected to the first wiring Lsi14 in $M_1$ which is adjacent to the first wiring Lsi13. It may be understood by those skilled in the art that there may be other numbers i of first wirings in each first wiring group, and a number of thin film transistors in a corresponding first switching circuit is set to (i-1), wherein i is an integer greater than one. A case of a first wiring group $M_2$ is similar to that of the first wiring group $M_1$, and details thereof will not be described here.

As shown in FIG. 3, a second switching circuit S1 in the display substrate 30 according to the embodiment of the present disclosure comprises at least one TFT, each having a control electrode connected to the control signal line 320, and a first electrode and a second electrode connected to two adjacent ones of second wirings in a second wiring group $N_1$ respectively. In the example of FIG. 3, the second wiring group $N_1$ may comprise four second wirings Lsi21, Lsi22, Lsi23, and Lsi24, and the second switching circuit S1 may comprise three thin film transistors T1, T2, and T3. The transistor T1, the transistor T2, and the transistor T3 each have a control electrode connected to the control signal line 320. The transistor T1 has a first electrode connected to the second wiring Lsi21, and a second electrode connected to the second wiring Lsi22 in $N_1$ which is adjacent to the second wiring Lsi21. The transistor T2 has a first electrode connected to the second wiring Lsi22, and a second electrode connected to the second wiring Lsi23 in $N_1$ which is adjacent to the second wiring Lsi22. The transistor T3 has a first electrode connected to the second wiring Lsi23, and a second electrode connected to the second wiring Lsi24 in $N_1$ which is adjacent to the second wiring Lsi23. It may be understood by those skilled in the art that there may be other numbers j of second wirings in each second wiring group, and a number of thin film transistors in a corresponding second switching circuit is set to (j-1), wherein j is an integer greater than one. A case of a second wiring group $N_2$ is similar to that of the first wiring group $N_1$, and details thereof will not be described here.

In addition, it may be understood by those skilled in the art that, for the sake of brevity, only two first wiring groups $M_1$ and $M_2$ and two second wiring groups $N_1$ and $N_2$ are shown in the example of FIG. 3, and the display substrate according to the embodiment of the present disclosure may comprise more first wiring groups and more second wiring groups.

Figure 4:
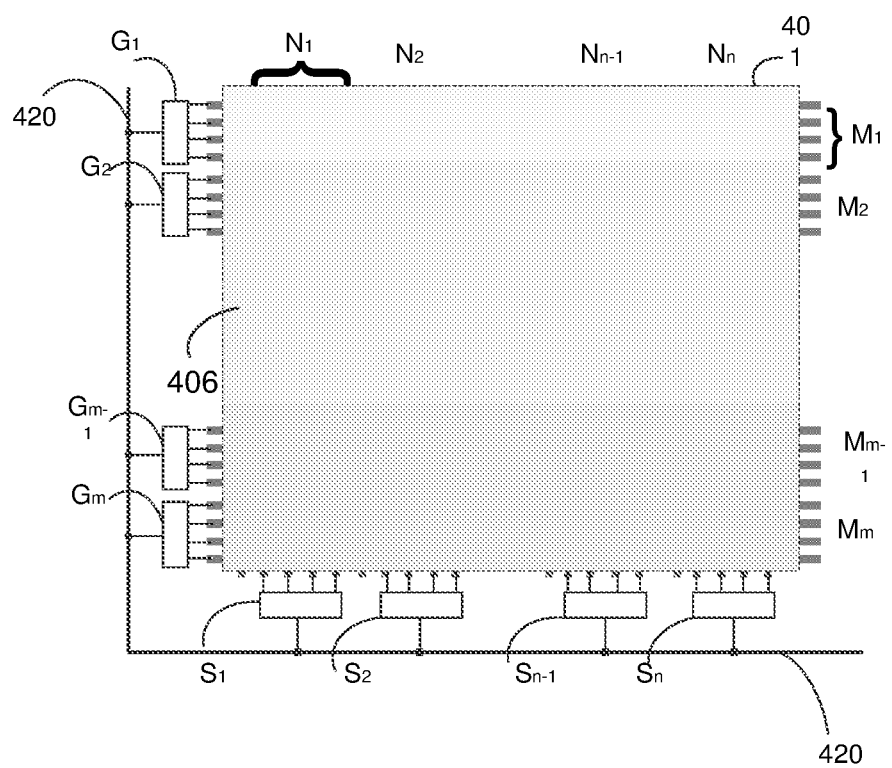
FIG. 4 illustrates a schematic view of a display substrate according to yet another embodiment of the present disclosure.

FIG. 4 illustrates a schematic view of a display substrate according to yet another embodiment of the present disclosure. As shown in FIG. 4, the display substrate 40 according to the embodiment of the present disclosure may further comprise a single common electrode 401. For example, the common electrode 401 may be formed as a whole instead of being divided into a plurality of common electrode blocks. The common electrode 401 is electrically connected to second wiring groups via at least one second via 406. A plurality of second vias 406 may be uniformly provided on the display substrate 40 to be electrically connected to the respective second wiring groups, so that a uniform common voltage Vcom may be provided to the common electrode 401 during a display period of the display substrate 40.

Figure 5:
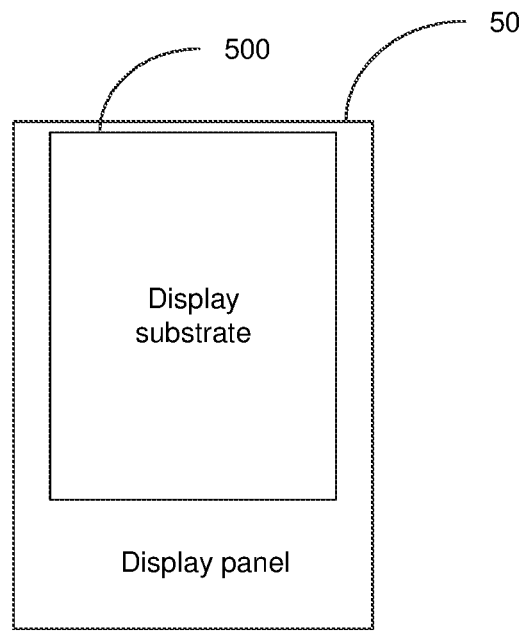
FIG. 5 illustrates a schematic block diagram of a display panel according to an embodiment of the present disclosure.

According to another aspect of the embodiments of the present disclosure, there is provided a display panel. As shown in FIG. 5, the display panel 50 according to the embodiment of the present disclosure may comprise a display substrate 500 according to the embodiment of the present disclosure.

Figure 6:
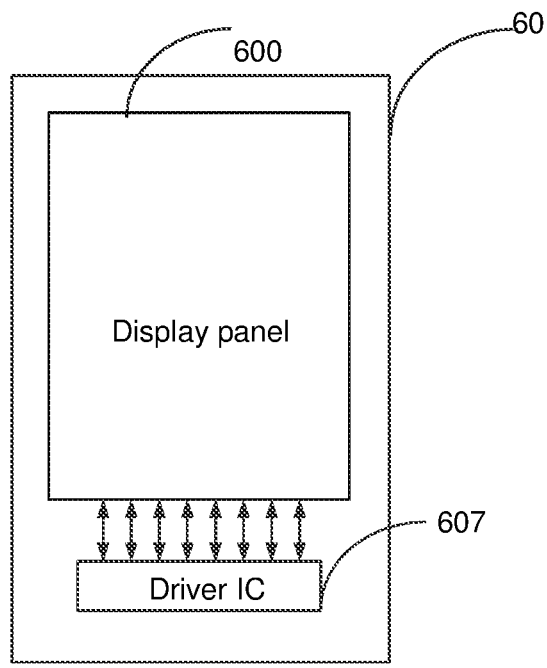
FIG. 6 illustrates a schematic block diagram of a display apparatus according to an embodiment of the present disclosure.

According to yet another aspect of the embodiments of the present disclosure, there is provided a display apparatus. As shown in FIG. 6, the display apparatus 60 according to the embodiment of the present disclosure may comprise a display panel 600 according to the embodiment of the present disclosure and a driver IC 607. The driver IC may output a common voltage signal Vcom during a display period and output a touch signal Tx during a touch period.

According to an embodiment of the present disclosure, the driver IC 607 may be connected to a common electrode via second wiring groups to provide the common voltage signal Vcom to the common electrode in the display period. The driver IC 607 may also be connected to each of first wiring groups via a transmission signal line in a corresponding one of the second wiring groups to provide the touch signal Tx to the first wiring group in the touch period.

The display apparatus 60 according to the embodiments of the present disclosure may be any product or component having a display function such as an electronic paper, a mobile phone, a tablet computer, a television, a display, a notebook computer, a digital photo frame, a navigator, etc.

Figure 7:
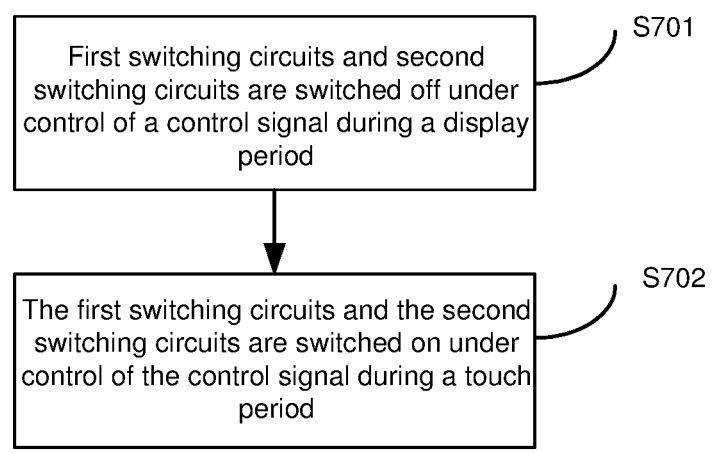
FIG. 7 illustrates a flowchart of a method for driving a display apparatus according to an embodiment of the present disclosure.

According to a further aspect of the embodiments of the present disclosure, there is provided a method for driving a display apparatus according to an embodiment of the present disclosure. FIG. 7 illustrates a flowchart of a method for driving a display apparatus. As shown in FIG. 7, the method 70 for driving a display apparatus according to the embodiment of the present disclosure may comprise the following steps. It should be illustrated that serial numbers of various steps in the following method are only used as a representation of the steps for the description, and should not be regarded as indicating an execution order of the respective steps. This method does not need to be performed exactly in an order as shown, unless explicitly stated.

In step S701, first switching circuits and second switching circuits are turned off under control of a control signal on a control signal line during a display period of one image frame.

In step S702, the first switching circuits and the second switching circuits are turned on under control of the control signal on the control signal line during a touch period of one image frame.

Figure 8:
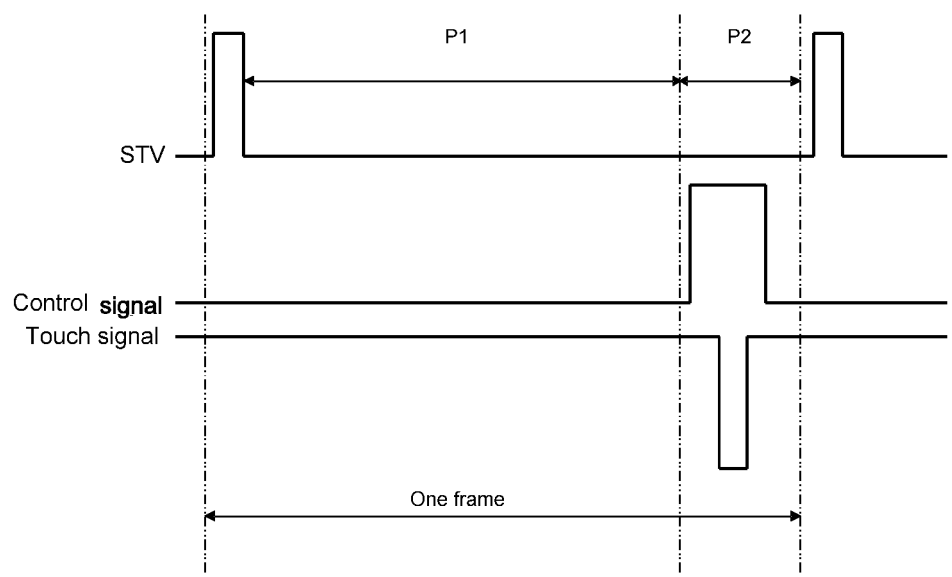
FIG. 8 illustrates a signal timing diagram of the method for driving a display apparatus according to an embodiment of the present disclosure.

FIG. 8 illustrates a signal timing diagram of the method for driving a display apparatus according to an embodiment of the present disclosure. The method for driving a display apparatus according to the embodiment of the present disclosure will be described in detail subsequently with reference to FIGS. 7 and 8. It should be illustrated that the following description is made by taking the first switching circuits and the second switching circuits being implemented as N-type transistors as an example. An implementation using P-type transistors is apparent on the basis of the embodiments of the present disclosure.

As shown in FIG. 8, a STart Vertical (STV) signal triggers display of one image frame. During a display period P1 of the one image frame, the control signal is at a low level, and thereby all transistors in the first switching circuits and the second switching circuits are turned off. Since transistors connected between respective first wirings in first wiring groups are turned off, the first wirings are disconnected from each other, and Gate drive On Array (GOA) circuits output a gate driving signal at this time. For example, the first wirings, as gate driving signal lines, are driven by the gate driving signal to perform gate scanning of a display picture, thereby performing a normal display operation. At the same time, since transistors between respective second wirings in second wiring groups are turned off, the second wirings are disconnected from each other.

In an example where the wirings in the second wiring groups are wiring located in a source/drain layer, source driving signal lines in the second wiring groups are driven by a source driving signal to perform data writing of the display picture, thereby performing a normal display operation. Further, a driver IC outputs a common voltage signal Vcom, and applies the common voltage signal Vcom to a common electrode via metal wirings in the source/drain layer in the second wiring groups.

In an example where the wirings in the second wiring groups are wiring located in a touch layer, the driver IC outputs the common voltage signal Vcom, and applies the common voltage signal Vcom to the common electrode via the wirings.

During a touch period P2, the control signal is at a high level, for example, the control signal may be at +12V, and thereby all the transistors in the first switching circuits and the second switching circuits are turned on. Since the transistors connected between the respective first wirings in the first wiring groups are turned on, the first wirings are electrically connected to each other. At this time, the GOA circuits stop outputting the gate driving signal, and thus have no effect on capacitance in pixel circuits. At the same time, the driver IC starts to output a touch signal at, for example, −12V, and applies the touch signal to each of the first wiring groups via a transmission signal lines in a corresponding one of the second wiring groups.

In this period P2, since the transistors connected between the respective second wirings in the second wiring groups are turned on, the second wirings are electrically connected to each other. At this time, the touch signal output from the driver IC is also applied to the second wirings in the second wiring groups. Thereby, the lateral first wiring groups and the longitudinal second wiring groups form a grid structure.

For example, in an example where the wirings in the second wiring groups are wirings located in the source/drain layer, the touch signal from the driver IC is applied to each of the first wiring groups via a transmission signal line (a wiring in the source/drain layer) in a corresponding one of the second wiring groups, and at the same time, the touch signal is applied to the second wiring group via other metal wirings in the source/drain layer in the second wiring group.

In an example where the wirings in the second wiring groups are wirings located in the touch layer, the touch signal from the driver IC is applied to each of the first wiring groups via a transmission signal line (a wiring in the touch layer) in a corresponding one of the second wiring groups, and at the same time, the touch signal is applied to the second wiring group via second wirings in the second wiring group.

When a finger touches a display area of the display substrate, capacitance formed between the finger and the grid structure at a position where the touch occurs abruptly changes. Specifically, self-inductance capacitance between the finger and a first wiring group at a position where the touch occurs changes, and the change is fed back to the driver IC via a transmission signal line electrically connected to the first wiring group. Thereby, a vertical coordinate of the position where the touch occurs may be determined. At the same time, self-inductance capacitance between the finger and a second wiring group at the position where the touch occurs changes, and the change is fed back to the driver IC via the second wiring group. Thereby, a horizontal coordinate of the position where the touch occurs may be determined. Thereby, the driver IC may determine the position where the touch occurs.

According to the embodiments of the present disclosure, the first wirings are used for longitudinal positioning and the second wirings are used for lateral positioning in the touch period of the display apparatus without using a common electrode, thereby effectively avoiding uneven display due to inconsistent voltages among common electrode blocks of the common electrode.

Further, in one embodiment of the present disclosure, the wirings located in the source/drain layer serve as the second wirings, and thereby the thickness of the display substrate may be reduced without providing an additional touch signal line.

Although the present disclosure has been specifically shown and described with reference to the exemplary embodiments of the present disclosure, it may be understood by those of ordinary skill in the art that these embodiments may be changed in forms and details without departing from the spirit and scope of the present disclosure which are defined by the appended claims.

The invention claimed is:

1. A display substrate, comprising:
   a plurality of first wiring groups each comprising a plurality of first wirings extending in a first direction;
   a plurality of second wiring groups each comprising a plurality of second wirings and at least one transmission signal line extending in a second direction crossing the first direction;
   a plurality of first switching circuits each connecting a plurality of first wirings in a corresponding one of the first wiring groups to a control signal line;
   a plurality of second switching circuits each connecting a plurality of second wirings in a corresponding one of the second wiring groups to the control signal line; and
   a gate layer and a source/drain layer;
   wherein for each of the first wiring groups, at least one first wiring is electrically connected to a transmission signal line in a corresponding one of the plurality of second wiring groups via at least one first via; and
   wherein the plurality of first wirings are located in the gate layer, and the plurality of second wirings and the transmission signal line are located in the source/drain layer.

2. The display substrate according to claim 1, wherein:
   each of the plurality of first switching circuits comprises at least one first Thin Film Transistor (TFT), each first TFT having a control electrode connected to the control signal line, and a first electrode and a second electrode connected to two adjacent first wirings in a corresponding one of the plurality of first wiring groups, respectively; and
   each of the plurality of second switching circuits comprises at least one second TFT, each second TFT having a control electrode connected to the control signal line, and a first electrode and a second electrode connected to two adjacent second wirings in a corresponding one of the plurality of second wiring groups, respectively.

3. The display substrate according to claim 1, wherein the plurality of second wirings comprise wirings for touch sensing.

4. The display substrate according to claim 1, further comprising a single common electrode.

5. The display substrate according to claim 4, wherein the common electrode is electrically connected to the second wiring groups via at least one second via.

6. A display panel, comprising the display substrate according to claim 1.

7. A display apparatus, comprising the display panel according to claim 6 and a driver Integrated Circuit (IC).

8. The display apparatus according to claim 7, wherein the driver IC is connected to the second wiring groups and is connected to the first wiring groups via the transmission signal line.

9. The display apparatus according to claim 7, wherein the driver IC is connected to a common electrode via the second wiring groups.

10. A method for driving the display apparatus according to claim 7, the method comprising:
    switching off, during a display period of an image frame, the first switching circuits and the second switching circuits under control of a control signal on the control signal line; and
    switching on, during a touch period of the image frame, the first switching circuits and the second switching circuits under control of the control signal.

11. The method according to claim 10, wherein the driver IC is configured to, during the touch period, apply a touch scanning signal to the first wiring groups, and detect whether self-capacitance of the first wirings and the second wirings change.

* * * * *